(12) United States Patent
Kinoshita (10) Patent No.: US 7,965,549 B2
(45) Date of Patent: Jun. 21, 2011

(54) SEMICONDUCTOR INTEGRATED CIRCUIT DEVICE AND METHOD OF OPERATING SAME

(75) Inventor: Shigeru Kinoshita, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1126 days.

(21) Appl. No.: 11/689,153

(22) Filed: Mar. 21, 2007

(65) Prior Publication Data

US 2008/0074921 A1    Mar. 27, 2008

(30) Foreign Application Priority Data

Sep. 25, 2006   (JP) ................................. 2006-258395

(51) Int. Cl.
*G11C 16/04* (2006.01)
(52) U.S. Cl. .............................. 365/185.03; 365/185.17
(58) Field of Classification Search ............. 365/185.03, 365/185.17, 185.11
See application file for complete search history.

(56) References Cited

U.S. PATENT DOCUMENTS

| | | | | |
|---|---|---|---|---|
| 6,064,591 A | * | 5/2000 | Takeuchi et al. | 365/185.03 |
| 7,539,053 B2 | * | 5/2009 | Kanda | 365/185.03 |
| 2006/0202257 A1 | * | 9/2006 | Kutsukake et al. | 257/315 |
| 2008/0112221 A1 | * | 5/2008 | Park et al. | 365/185.03 |
| 2008/0205148 A1 | * | 8/2008 | Kanda | 365/185.17 |

FOREIGN PATENT DOCUMENTS

| | | |
|---|---|---|
| JP | 2004-192789 | 7/2004 |
| KR | 1999013057 A | 2/1999 |

OTHER PUBLICATIONS

Korean Office Action dated Jan. 28, 2009.

* cited by examiner

*Primary Examiner* — Vu A Le
(74) *Attorney, Agent, or Firm* — Pearne & Gordon LLP (57) ABSTRACT

A semiconductor integrated circuit device includes a memory cell array. In the memory cell array, first memory cells of floating gate type are mixed with second memory cells of floating gate type. The second memory cell is sandwiched between the first memory cells. The first memory cells of floating gate type are configured to store m-level data, where m is a natural number of 2 or more. The second memory cells of floating gate type is configured to store n-level data, where n is a natural number greater than m.

17 Claims, 8 Drawing Sheets

SEMICONDUCTOR INTEGRATED CIRCUIT DEVICE AND METHOD OF OPERATING SAME

CROSS-REFERENCE TO RELATED APPLICATIONS

This application is based upon and claims the benefit of priority from the prior Japanese Patent Application No. 2006-258395, filed on Sep. 25, 2006; the entire contents of which are incorporated herein by reference.

BACKGROUND OF THE INVENTION

1. Field of the Invention

This invention relates to a semiconductor integrated circuit device and a method of operating same, and more particularly to a semiconductor integrated circuit device including memory cells for storing multilevel data and a method of operating same.

2. Background Art

In recent years, nonvolatile semiconductor memory devices, which allow electric bulk erase and rewrite of data and in which the written data can be held without power supply, are widely used particularly in mobile devices. Such a nonvolatile semiconductor memory device is composed of memory MOS (Metal Oxide Semiconductor) transistors, which each have a tiny floating gate electrode surrounded by an insulating film, and interconnects for data input/output. The memory device retains memory by accumulating electric charge in the floating gate electrode.

Recently, nonvolatile semiconductor memory devices are downscaled, and the spacing between adjacent memory cells is significantly narrowed. As the cell-to-cell spacing is narrowed, the capacitance between floating gates in adjacent cells increases. Then the threshold of the previously written cell tends to vary because it is more susceptible to the capacitance between floating gate electrodes with its adjacent cell that is subsequently written. In particular, a multilevel memory (JP 2004-192789A), which stores multilevel data in one cell, has a plurality of thresholds. Hence the threshold distribution per one data must be controlled in a very narrow range, and unfortunately, the threshold is likely to vary in response to the accumulated charge in its adjacent cell.

SUMMARY OF THE INVENTION

According to an aspect of the invention, there is provided a memory cell array, in which first memory cells of floating gate type configured to store m-level data, where m is a natural number of 2 or more, are mixed with second memory cells of floating gate type configured to store n-level data, where n is a natural number greater than m, the second memory cell being sandwiched between the first memory cells.

According to another aspect of the invention, there is provided a semiconductor integrated circuit device including: a memory cell array, in which first memory cells of floating gate type configured to store m-level data, where m is a natural number of 2 or more, are mixed with second memory cells of floating gate type configured to store n-level data, where n is a natural number greater than m, the second memory cell being sandwiched between the first memory cells; and a control circuit configured to write data to the first memory cell earlier and then writing data to the second memory cell.

According to another aspect of the invention, there is provided a method of operating a semiconductor integrated circuit device including a memory cell array, in which first memory cells of floating gate type configured to store m-level data, where m is a natural number of 2 or more, are mixed with second memory cells of floating gate type configured to store n-level data, where n is a natural number greater than m, the second memory cell being sandwiched between the first memory cells, the method including: writing data to the first memory cell earlier and then writing data to the second memory cell, when data is written to the memory cell array.

DETAILED DESCRIPTION OF THE INVENTION

Figure 2:
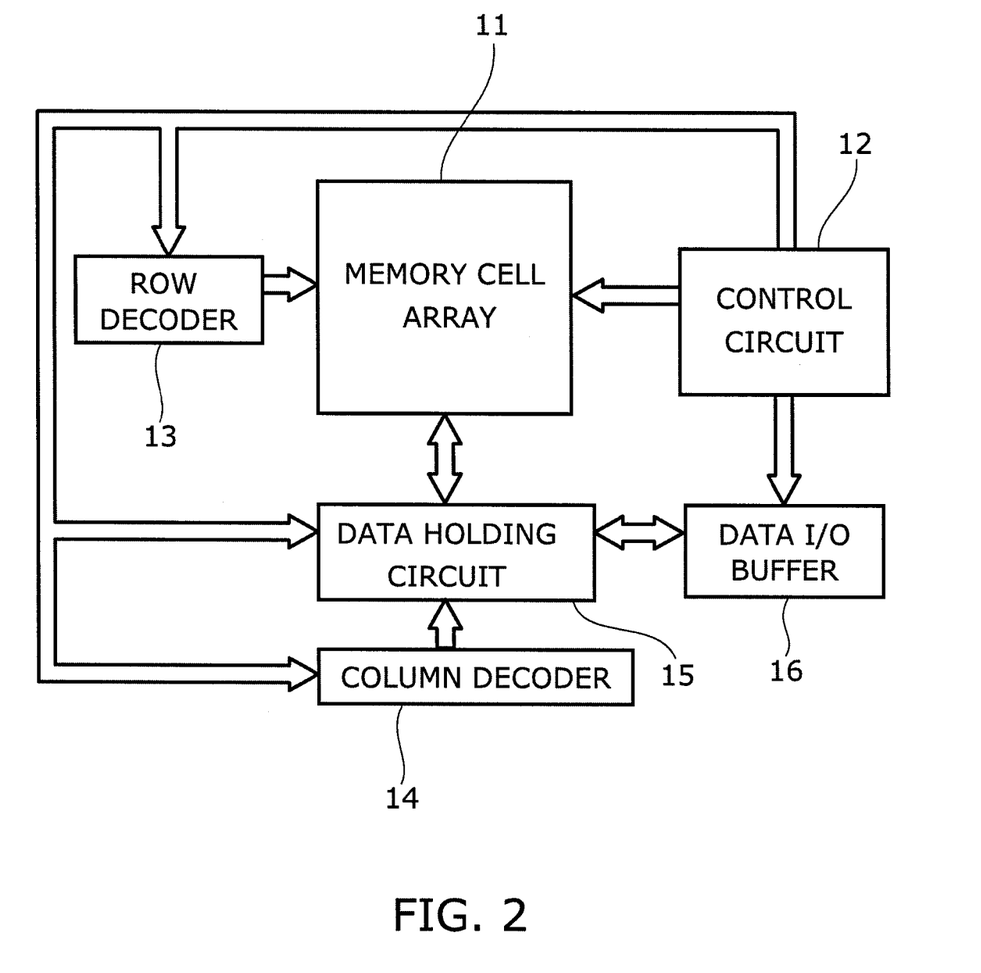
FIG. 2 is a block diagram showing the configuration of the semiconductor integrated circuit device according to the embodiment of the invention.

FIG. 2 is a block diagram showing the configuration of a nonvolatile semiconductor memory device, which is a semiconductor integrated circuit device according to the embodiment of the invention.

The nonvolatile semiconductor memory device according to this embodiment comprises a memory cell array 11, a row decoder 13, a column decoder 14, a data holding circuit 15, a data input/output buffer 16, and a control circuit 12.

Figure 3:
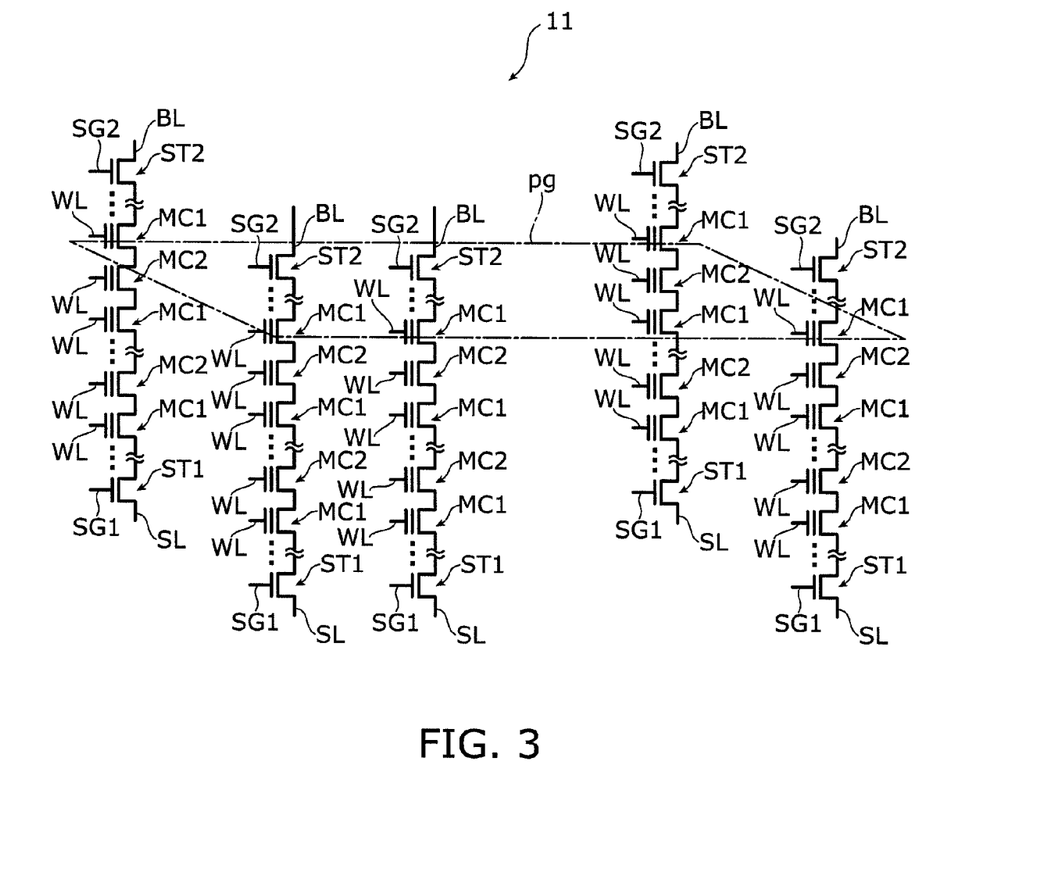
FIG. 3 is a schematic diagram showing the circuit configuration of a memory cell array in the semiconductor integrated circuit device according to the embodiment of the invention.

FIG. 3 is a schematic diagram showing the circuit configuration of the memory cell array 11 in the nonvolatile semiconductor memory device according to the embodiment of the invention.

Figure 1:
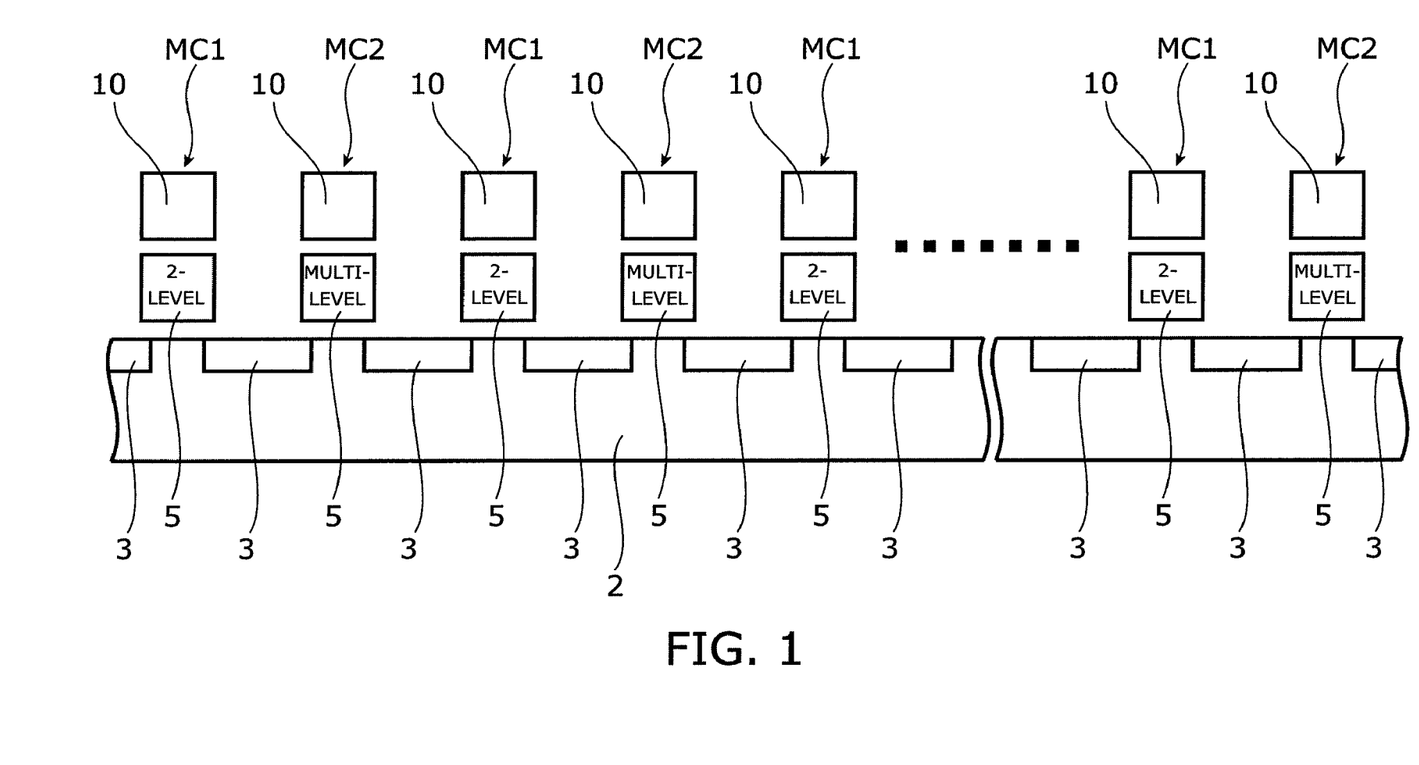
FIG. 1 is a schematic diagram showing the cell arrangement of the main part of a memory cell array in a semiconductor integrated circuit device according to an embodiment of the invention.

FIG. 1 is a schematic diagram showing the cell arrangement of the main part of the memory cell array 11.

The memory cell array 11 includes a plurality of memory cells MC1, MC2, a plurality of bit lines BL, a plurality of word lines WL, and a common source line SL. In the memory cell array 11, first memory cells MC1 and second memory cells MC2 having different numbers of memory bits are mixed. These memory cells MC1, MC2 are arranged in a matrix configuration.

Each of the first memory cell MC1 and the second memory cell MC2 is a floating gate memory cell where a floating gate electrode is provided between a channel and a control gate electrode. As shown in FIG. 1, drain/source regions 3 are formed in a semiconductor layer 2 of e.g. silicon. On the drain/source region 3, a floating gate electrode 5 is provided via an insulating film. On the floating gate electrode 5, a control gate electrode 10 is provided via an insulating film. The floating gate electrode 5 is surrounded by the insulating film and is not electrically connected to anywhere.

The nonvolatile semiconductor memory device according to this embodiment is illustratively a NAND flash memory, and the memory cell array 11 includes a plurality of NAND cell columns. One NAND cell column includes a plurality of memory cells MC1, MC2 series-connected between a bit line BL and the source line SL. The memory cells MC1, MC2 in the NAND cell column are series-connected, having a drain/source region 3 in common between adjacent memory cells.

Selection transistors ST1, ST2 are connected to one end and the other end of each NAND cell column, respectively. The selection transistor ST1 is connected to the common source line SL. The selection transistor ST2 is connected to a corresponding one of the plurality of bit lines BL. The gate of the selection transistor ST1 is connected to a select line SG1. The gate of the selection transistor ST2 is connected to a select line SG2.

The control gate electrode of each memory cell MC1, MC2 is connected to a corresponding one of the plurality of word lines WL. To one word line WL, a corresponding memory cell MC1. MC2 in each NAND column is connected in common to constitute one page pg. For example, data write is simultaneously performed using the page pg as a unit.

Referring again to FIG. 2, the row decoder 13 selects a word line WL in the memory cell array 11, and applies a voltage required for read, write, or erase to the selected word line WL.

In the data read operation from the memory cell array 11, the data holding circuit 15 temporarily holds data retrieved through the bit line BL. In the data write operation to the memory cell array 11, the data holding circuit 15 temporarily holds data to be written and supplies it to the memory cell array 11 through the bit line BL.

The data input/output buffer 16 and the column decoder 14 are connected to the data holding circuit 15. In the data read operation, from among the retrieved data held in the data holding circuit 15, only the data selected in response to the output of the column decoder 14 is read to the outside through the data input/output buffer 16. In the data write operation, the data to be written supplied from the outside through the data input/output buffer 16 is held in a latch circuit in the data holding circuit 15 selected in response to the output of the column decoder 14.

The memory cell array 11, the row decoder 13, the column decoder 14, the data holding circuit 15, and the data input/output buffer 16 are connected to the control circuit 12. The control circuit 12 decodes commands from the outside and outputs various control signals. On the basis of control signals outputted from the control circuit 12, the memory cell array 11, the row decoder 13, the column decoder 14, the data holding circuit 15, and the data input/output buffer 16 are controlled in their operation.

As shown in FIG. 1, in each NAND cell column, the first memory cells MC1 and the second memory cells MC2 are alternately series-connected. The first memory cell MC1 stores m-level (m is a natural number of 2 or more). The second memory cell MC2 stores n-level (n is a natural number greater than m). For example, the first memory cell MC1 stores 2-level (1-bit) data, and the second memory cell MC2 stores 4-level (2-bit) data.

Figure 4:
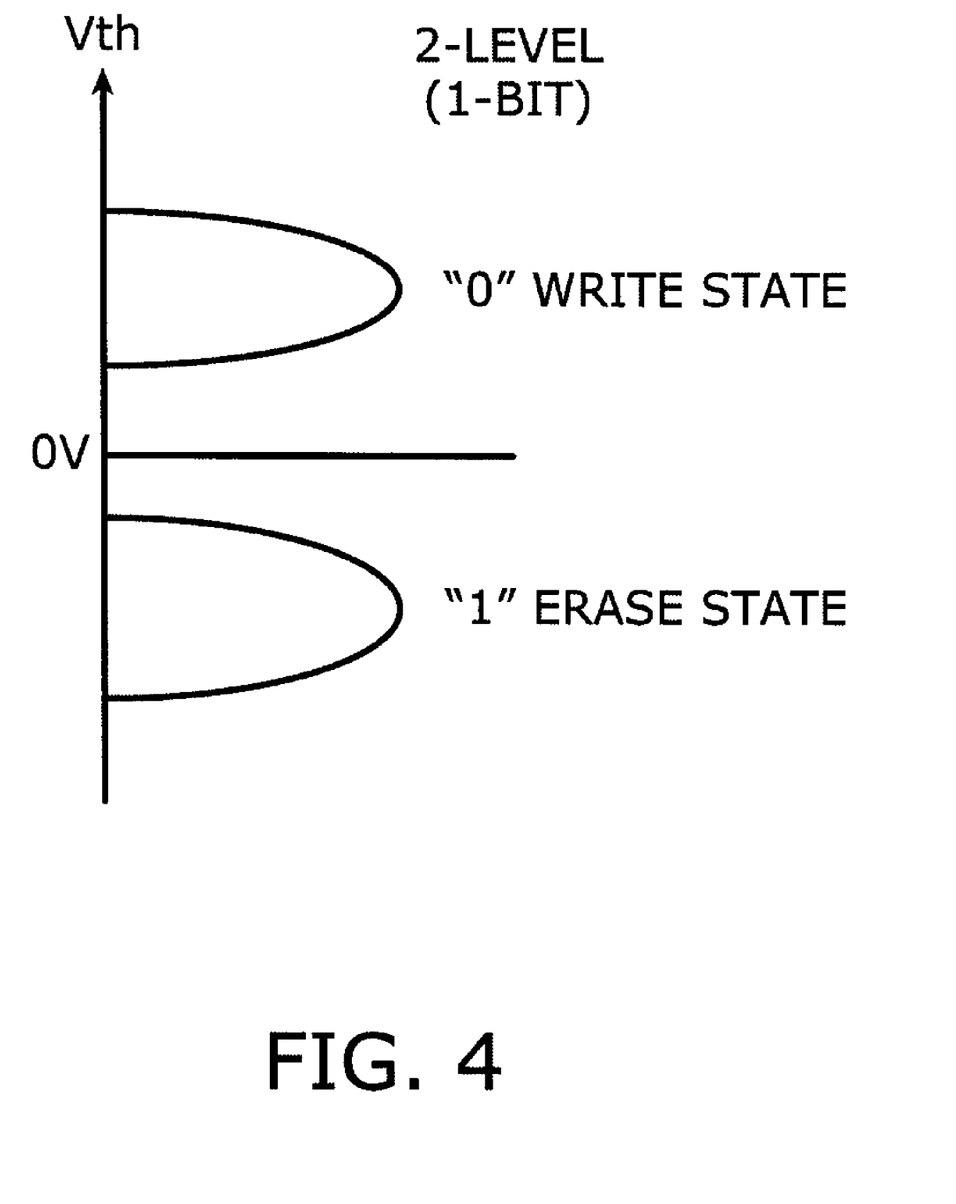
FIG. 4 shows a threshold distribution where 2-level (1-bit) logical data ("0", "1") is stored in a first memory cell.

FIG. 4 shows a threshold distribution where 2-level (1-bit) logical data ("0", "1") is stored in the first memory cell MC1.

Figure 5:
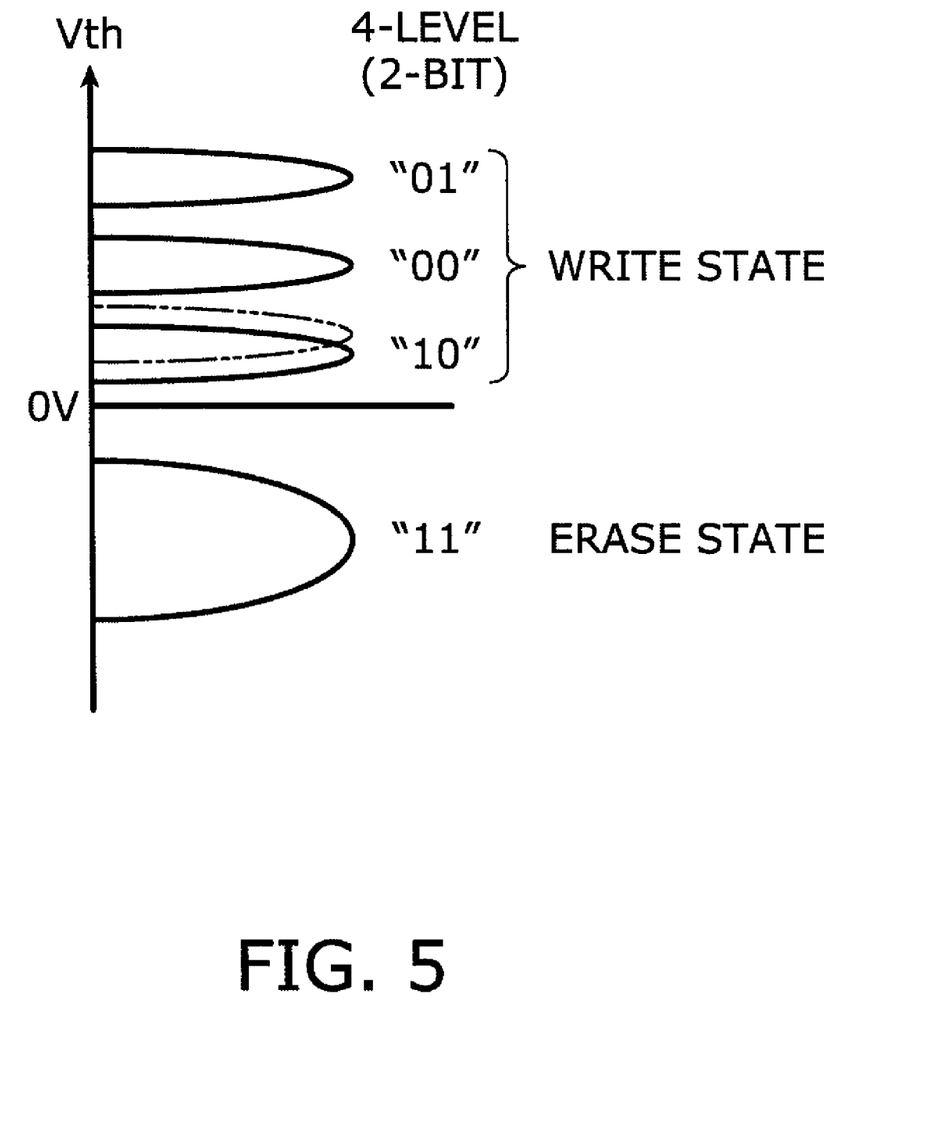
FIG. 5 shows a threshold distribution where 4-level (2-bit) logical data ("01", "00", "10", "11") is stored in a second memory cell.

FIG. 5 shows a threshold distribution where 4-level (2-bit) logical data ("01", "00", "10", "11") is stored in the second memory cell MC2.

In FIGS. 4 and 5, the vertical axis represent threshold Vth, and the horizontal axis represents the frequency of memory cells having the corresponding threshold.

The number of first memory cells MC1 and second memory cells MC2 (the number of word lines WL) series-connected in each NAND cell column is defined so that the total number of bits for memory data in each NAND cell column is the i-th power of 2 (i is a natural number of 2 or more). For example, the number of first memory cells MC1 and second memory cells MC2 is defined so that the number of memory bits in each NAND cell column is 32 bits, 64 bits, or 128 bits. Hence, to satisfy this condition, each NAND cell column may include a portion where the first memory cells MC1 and the second memory cells MC2 are not alternately arranged (a portion where two first memory cells MC1 or two second memory cells MC2 consecutively occur).

In a nonvolatile semiconductor device, electrons are injected from the channel of the semiconductor layer 2 into the floating gate electrode 5 by the quantum-mechanical tunneling phenomenon, and thereby the electrons are accumulated in the floating gate electrode 5. The threshold (voltage) Vth of the memory cell transistor is shifted depending on the amount of electrons accumulated in the floating gate electrode 5, whereby logical data is stored. As the distance between adjacent floating gate electrodes 5 decreases with the device downscaling, the problem of increased capacitance between floating gate electrodes occurs.

FIG. 7 is a schematic diagram for illustrating the capacitive coupling between adjacent floating gate electrodes 5 in a 4-level cell, for example.

Figure 7A:
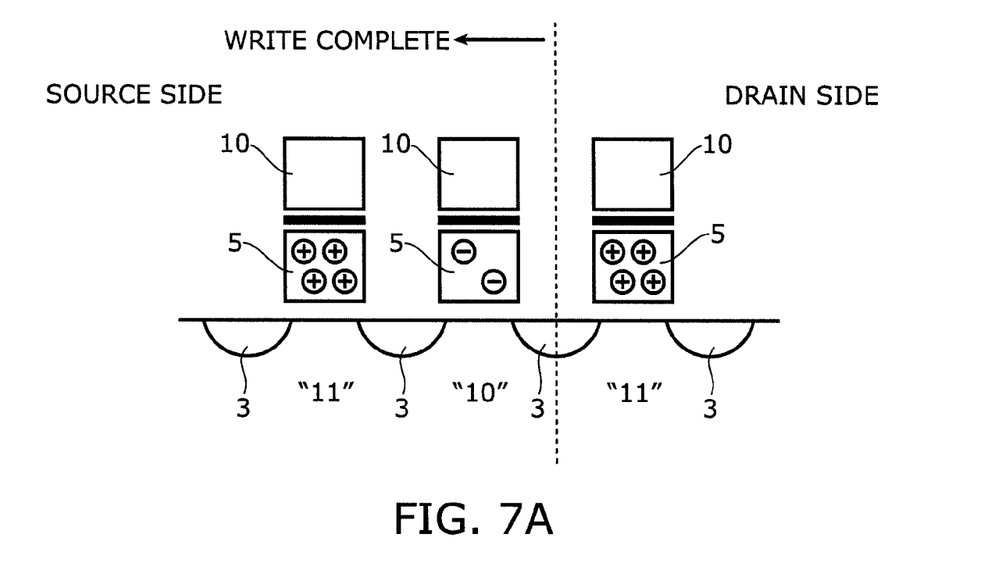
FIG. 7 is a schematic diagram for illustrating the capacitive coupling between adjacent floating gate electrodes in a 4-level cell.
Figure 7B:
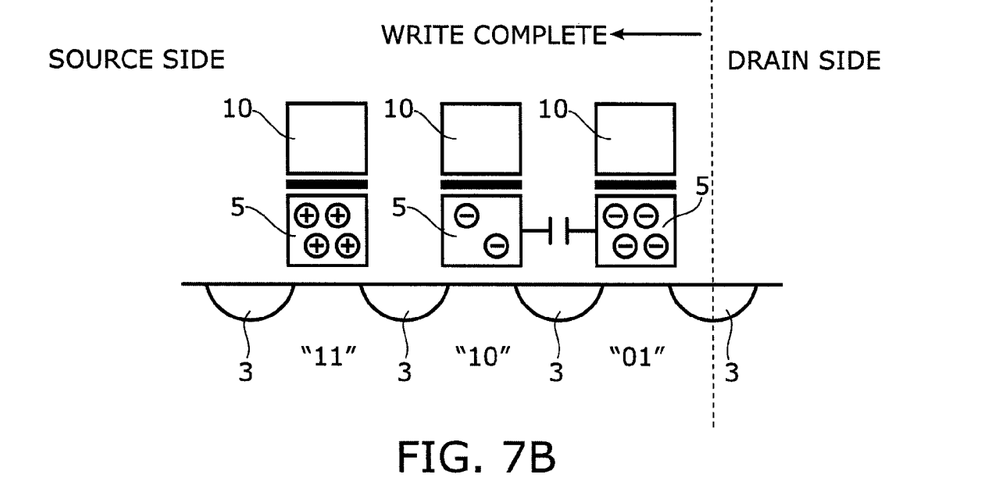

In the case of a write operation from the state of FIG. 7A to the state of FIG. 7B, when the distance between adjacent floating gate electrodes 5 decreases, the threshold of the floating gate electrode 5 holding e.g. data "10", which has been previously written, may be affected by the electric charge in the adjacent floating gate electrode 5 to which e.g. data "01" is written subsequently.

Hence the threshold distribution of data "10", which is to be established normally in the range shown by the solid line in FIG. 5, is shifted as shown by the double-dot dashed line, and the spacing to the threshold distribution of data "00" is narrowed. This may contribute to reducing device reliability.

In a NAND flash memory, before a write operation, all the memory cells are set to the erase state ("1" or "11") by a bulk erase operation. That is, electrons are extracted from the floating gate electrodes 5, and all the memory cells have a threshold of e.g. −1 V or less. Then, in writing "1" or "11", the state of the memory cell is left unchanged. Only in writing "0", "10", "00", or "01", electrons are injected into the floating gate electrode 5 to set the threshold to a desired range, thereby writing the data.

Comparing between adjacent memory cells, the memory cell to which data is written earlier is more susceptible to the threshold variation due to the capacitance between floating gate electrodes in adjacent memory cells. In the data write operation, data is written with the threshold being monitored. Hence, if the memory cell to which the data is being written is affected in the capacitance between floating gate electrodes by its adjacent memory cells, the memory cell can be set to a desired threshold distribution. That is, with regard to adjacent memory cells, the memory cell to which data is written later can be set to a desired threshold distribution by data write with the threshold being monitored even if it is affected in the capacitance between floating gate electrodes by its adjacent memory cell to which data is written earlier.

In this embodiment, the second memory cells MC2 to which multilevel (4-level) data is written are separated from each other to sandwich a first memory cell MC1 to which 2-level data is written so that the second memory cells MC2 are not adjacently arranged. Furthermore, in the data write operation, the control circuit 12 performs data write to the first memory cell MC1 earlier, and then performs data write to the second memory cell MC2. Hence, after write to a second memory cell MC2 is performed with the threshold being monitored, write to the adjacent first memory cell MC1 is not performed. Therefore it is possible to avoid the variation of threshold distribution of the second memory cell MC2 due to write to the adjacent first memory cell MC1 after write to the second memory cell MC2. That is, the desired threshold distribution established in the write operation to the second memory cell MC2 can be held stably.

The first memory cell MC1 written earlier is affected by the capacitance between floating gate electrodes in the write operation to the second memory cell MC2, and the threshold established and held in the first memory cell MC1 varies. However, the threshold distribution in the write state of the first memory cell MC1 (FIG. 4), which is a 2-level cell, can be made broader than the threshold distribution in the write state of the second memory cell MC2 (FIG. 5), which is a 4-level cell. Hence the read/write operation is not seriously affected even if the threshold distribution varies to some extent.

As described above, according to this embodiment, the first memory cells MC1, which are 2-level cells, are mixed with the second memory cells MC2, which are multilevel cells. Thus the memory capacity can be increased relative to a memory cell array having only 2-level cells. Furthermore, reliability can be ensured by preventing the problem (threshold variation due to the capacitance between floating gate electrodes) which is likely to occur in multilevel cells, which have a narrower threshold distribution in the write state than 2-level cells.

In the above example, the second memory cell MC2, which is a multilevel data memory cell, is a memory cell storing 4-level data. However, the data stored in the memory cell is not limited to 4-level, but may be 3-level or 5-level or more. Furthermore, for example, the invention is also applicable to a combination of the first memory cell MC1 being a 4-level cell and the second memory cell MC1 being a 8-level cell, and a combination of the first memory cell MC1 being a 2-level cell and the second memory cell MC1 being a 8-level cell.

More specifically, an n-level cell (n is a natural number greater than m) having a larger memory capacity than an m-level cell (m is a natural number of 2 or more) is sandwiched between the m-level cells, which have a smaller memory capacity but have a broader threshold distribution than the n-level cell to separate the n-level cells from each other so that the n-level cells are not adjacently arranged. Furthermore, data write to the m-level cell is performed earlier, and then data write to the n-level cell is performed. Thus the memory capacity can be increased relative to a memory cell array having only m-level cells. Furthermore, reliability can be ensured by preventing the problem (threshold variation due to the capacitance between floating gate electrodes) which is likely to occur in a memory cell array having only n-level cells.

Figure 6:
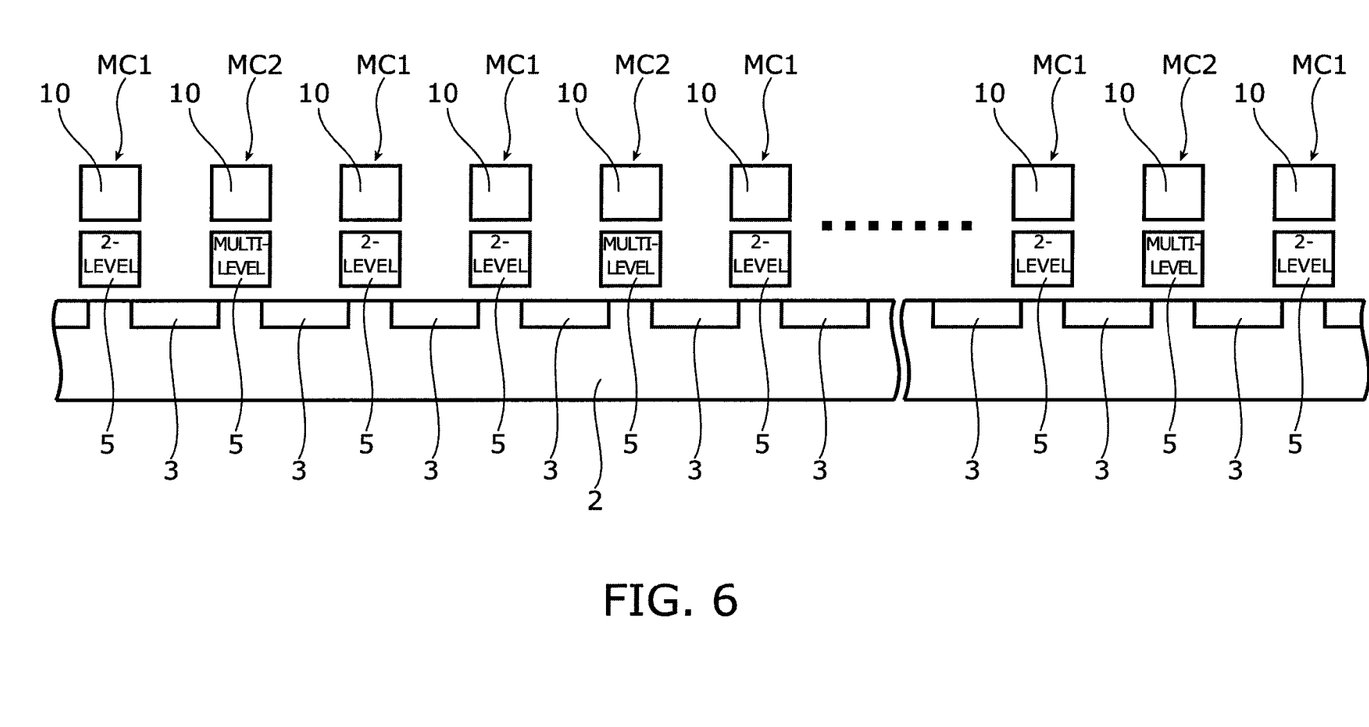
FIG. 6 is a schematic diagram showing the cell arrangement of the main part of a memory cell array in a semiconductor integrated circuit device according to another embodiment of the invention.

FIG. 6 is a schematic diagram showing another example cell arrangement in a NAND cell column.

In this example, three memory cells composed of a second memory cell (multilevel cell) MC2 sandwiched between two first memory cells (2-level cells) MC1 are treated as one unit, and this unit is repeatedly arranged in the NAND cell column direction (series-connection direction).

Also in this example, a multilevel cell having a larger memory capacity than a 2-level cell is sandwiched between the 2-level cells, which have a smaller memory capacity but have a broader threshold distribution than the multilevel cell to separate the multilevel cells from each other so that the multilevel cells are not adjacently arranged. Furthermore, data write to the 2-level cell is performed earlier, and then data write to the multilevel cell is performed. Thus the memory capacity can be increased relative to a memory cell array having only 2-level cells. Furthermore, reliability can be ensured by preventing the problem (threshold variation due to the capacitance between floating gate electrodes) which is likely to occur in a memory cell array having only multilevel cells.

However, in this example, two 2-level cells are arranged between the multilevel cells. For the same number of bits, the memory cell array size can be made smaller in the example shown in FIG. 1 described previously, where one 2-level cell is arranged between the multilevel cells. In other words, assuming that the structure of FIG. 1 has the same memory cell array size as the structure of FIG. 6, the memory capacity can be made larger in the structure of FIG. 1.

In the portion where the first memory cell MC1 and the second memory cell MC2 are alternately arranged, the first memory cell MC1 and the second memory cell MC2 may be parallel-connected to the bit line.

Figure 8:
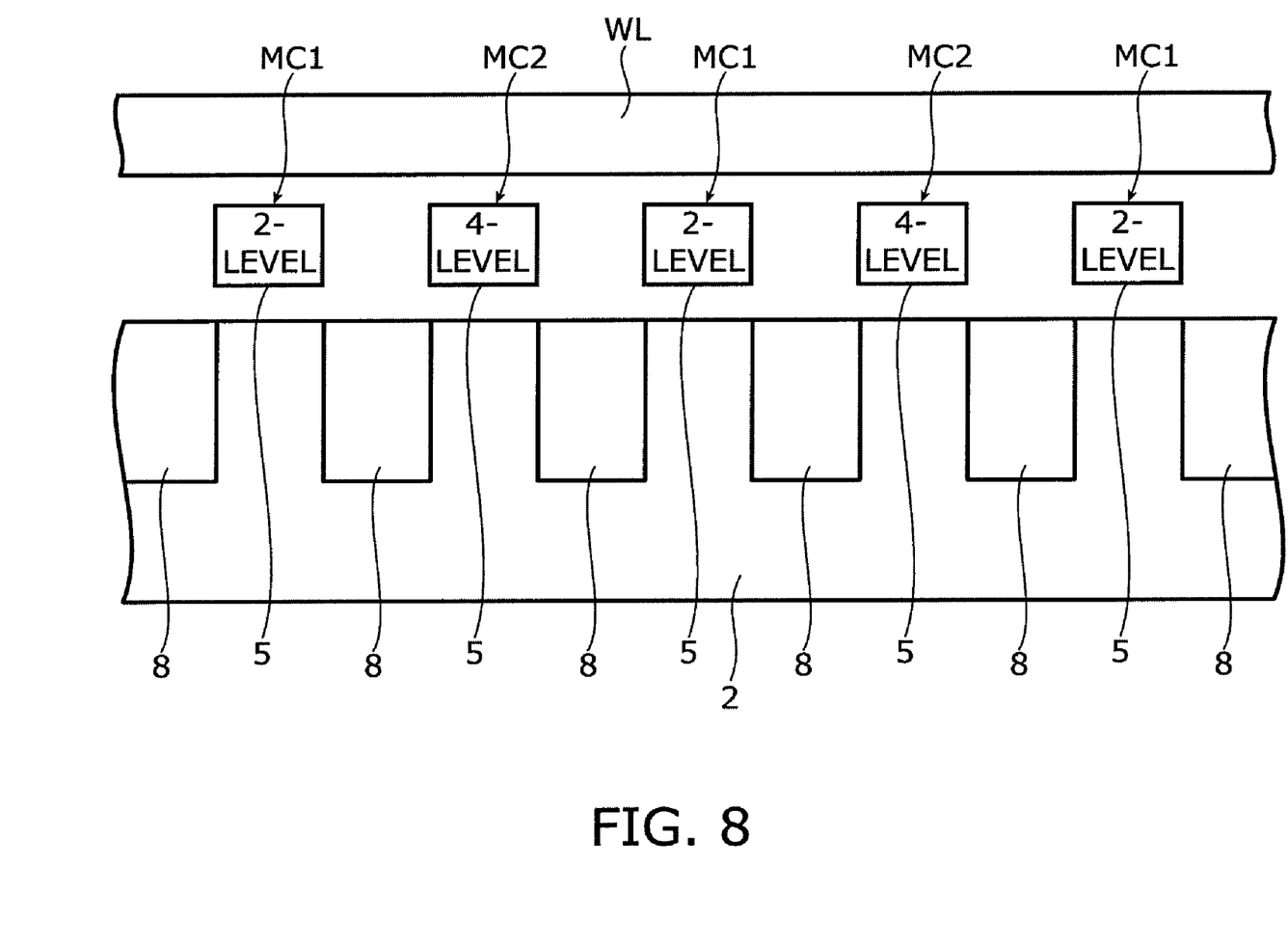
FIG. 8 is a schematic diagram showing the cell arrangement of the main part of a memory cell array in a semiconductor integrated circuit device according to still another embodiment of the invention.

FIG. 8 is a schematic diagram showing the cross-sectional structure of the main part of the cell array in the extending direction of the word line WL (control gate electrode 10).

As shown in FIG. 8, the first memory cells MC1 and the second memory cells MC2 may be alternately arranged in the extending direction of the word line WL. The adjacent cells in the extending direction of the word line are insulatively isolated from each other by a device isolation insulating layer 8.

In the write operation to the cell column shown in FIG. 8, the control circuit 12 described above performs data write to the first memory cell MC1 earlier, and then performs data write to the second memory cell MC2.

In the write operation to the first memory cell MC1 (2-level cell), the selection transistor of the second memory cell MC2 (4-level cell) is turned off. Thus the channel potential of the second memory cell MC2 increases, and no electron is injected from the channel to the floating gate electrode 5 of the second memory cell MC2, that is, the second memory cell MC2 is not written. In the write operation to the second memory cell MC2, the selection transistor of the first memory cell MC1 is turned off. Thus the channel potential of the first memory cell MC1 increases, and no electron is injected from the channel to the floating gate electrode 5 of the first memory cell MC1, that is, the first memory cell MC1 is not written. In this manner, among memory cells having a word line WL in common, the write operation can be selectively performed.

Also in this example, after write to a second memory cell MC2 is performed with the threshold being monitored, write to the adjacent first memory cell MC1 is not performed. Therefore it is possible to avoid the variation of threshold distribution of the second memory cell MC2 due to write to the adjacent first memory cell MC1 after write to the second memory cell MC2. That is, the desired threshold distribution established in the write operation to the second memory cell MC2 can be held stably.

The first memory cell MC1 written earlier is affected by the capacitance between floating gate electrodes in the write operation to the second memory cell MC2, and the threshold established and held in the first memory cell MC1 varies. However, the threshold distribution in the write state of the first memory cell MC1, which is a 2-level cell, can be made broader than the threshold distribution in the write state of the second memory cell MC2, which is a 4-level cell. Hence the read/write operation is not seriously affected even if the threshold distribution varies to some extent.

The above-explained examples can be appropriately modified by those skilled in the art, and such modifications are also encompassed within the scope of the invention as long as they include the features of the invention.

The invention claimed is:

1. A semiconductor integrated circuit device comprising:
    a memory cell array, in which first memory cells of floating gate type configured to store m-level data, where m is a natural number of 2 or more, are mixed with second memory cells of floating gate type configured to store n-level data, where n is a natural number greater than m, the second memory cell being sandwiched between the first memory cells, and the first memory cells and the second memory cells are alternately arranged in a series-connected portion between a bit line and a source line.

2. The semiconductor integrated circuit device according to claim 1, wherein the number of the series-connected first memory cells and second memory cells is defined so that the total number of bits of memory data in the series-connected portion between the bit line and the source line is the i-th power of 2, where i is a natural number of 2 or more.

3. The semiconductor integrated circuit device according to claim 1, wherein the first memory cells and the second memory cells are alternately arranged in a direction of a word line with an insulating region sandwiched therebetween.

4. The semiconductor integrated circuit device according to claim 1, wherein the first memory cell stores 2-level data, and the second memory cell stores multilevel data of 3-level or more.

5. The semiconductor integrated circuit device according to claim 4, wherein the second memory cell stores multilevel data of 4-level.

6. The semiconductor integrated circuit device according to claim 1, wherein the memory cell array is a nonvolatile semiconductor memory.

7. The semiconductor integrated circuit device according to claim 1, wherein a threshold distribution in a write state of the first memory cell is broader than a threshold distribution in a write state of the second memory cell.

8. The semiconductor integrated circuit device according to claim 1, wherein after data is written to the second memory cell while motoring a threshold, data is not written to the first memory cell which is adjacent to the second memory cell.

9. A semiconductor integrated circuit device comprising:
    a memory cell array, in which first memory cells of floating gate type configured to store m-level data, where m is a natural number of 2 or more, are mixed with second memory cells of floating gate type configured to store n-level data, where n is a natural number greater than m, the second memory cell being sandwiched between the first memory cells;
    a control circuit configured to write data to the first memory cell earlier and then writing data to the second memory cell; and the first memory cells and the second memory cells are alternately arranged in a series-connected portion between a bit line and a source line.

10. The semiconductor integrated circuit device according to claim 9, wherein the number of the series-connected first memory cells and second memory cells is defined so that the total number of bits of memory data in the series-connected portion between the bit line and the source line is the i-th power of 2, where i is a natural number of 2 or more.

11. The semiconductor integrated circuit device according to claim 9, wherein the first memory cells and the second memory cells are alternately arranged in a direction of a word line with an insulating region sandwiched therebetween.

12. The semiconductor integrated circuit device according to claim 9, wherein the first memory cell stores 2-level data, and the second memory cell stores multilevel data of 3-level or more.

13. The semiconductor integrated circuit device according to claim 12, wherein the second memory cell stores multilevel data of 4-level.

14. The semiconductor integrated circuit device according to claim 9, wherein the memory cell array is a nonvolatile semiconductor memory.

15. The semiconductor integrated circuit device according to claim 9, wherein a threshold distribution in a write state of the first memory cell is broader than a threshold distribution in a write state of the second memory cell.

16. The semiconductor integrated circuit device according to claim 9, wherein after data is written to the second memory cell while motoring a threshold, data is not written to the first memory cell which is adjacent to the second memory cell.

17. A method of operating a semiconductor integrated circuit device including a memory cell array, in which first memory cells of floating gate type configured to store m-level data, where m is a natural number of 2 or more, are mixed with second memory cells of floating gate type configured to store n-level data, where n is a natural number greater than m, the second memory cell being sandwiched between the first memory cells, the method comprising:
    writing data to the first memory cell earlier and then writing data to the second memory cell, when data is written to the memory cell array, and after data is written to the second memory cell while motoring a threshold, data is not written to the first memory cell which is adjacent to the second memory cell.

* * * * *